(12) United States Patent
Wright et al.

(10) Patent No.: US 6,411,553 B1
(45) Date of Patent: Jun. 25, 2002

(54) SINGLE ENDED DATA BUS EQUILIBRATION SCHEME

(75) Inventors: Jeffrey P. Wright; Victor Wong, both of Boise; Charles L. Ingalls, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/653,249

(22) Filed: Aug. 31, 2000

(51) Int. Cl.$^7$ ................................................ G11C 7/00
(52) U.S. Cl. .................. 365/189.05; 365/203
(58) Field of Search ..................... 365/189.05, 202, 365/203, 233

(56) References Cited

U.S. PATENT DOCUMENTS

| | | | |
|---|---|---|---|
| 5,257,226 A | 10/1993 | McClure | 365/189.09 |
| 5,295,104 A | 3/1994 | McClure | 365/210 |
| 5,452,259 A | 9/1995 | McLaury | 365/230.05 |
| 5,566,112 A | 10/1996 | Lysinger | 365/196 |
| 5,737,276 A * | 4/1998 | Shin et al. | 365/230.08 |
| 5,910,920 A | 6/1999 | Keeth | 365/189.05 |
| 5,917,758 A | 6/1999 | Keeth | 365/189.05 |
| 5,923,594 A * | 7/1999 | Voshell | 365/189.05 |
| 6,134,153 A * | 10/2000 | Lines et al. | 365/189.02 |

* cited by examiner

*Primary Examiner*—Son Mai
(74) *Attorney, Agent, or Firm*—Dickstein Shapiro Morin & Oshinsky LLP

(57) ABSTRACT

A method and apparatus for biasing an open ended bus line to a predetermined voltage just prior to the arrival of a data signal. The bias on the bus line is used to move the voltage of a received data signal closer to trip points used to determine the logical value of the data signals. The equilibration circuit may be are enabled by a clock signal derived from a sense amplifier clock signal to ensure that the bias voltage is applied to the bus line just prior to the arrival of the data signal.

43 Claims, 8 Drawing Sheets

SINGLE ENDED DATA BUS EQUILIBRATION SCHEME

BACKGROUND OF THE INVENTION

1. Field of The Invention

The present invention relates generally to equilibration circuitry for a data bus, and more specifically, to a method and apparatus for equilibration of a single ended data bus.

2. Description of The Related Art

In memory devices, such as dynamic random access memory (DRAM) devices, buses are used as communications pathways linking together various modules of the system. Typically these buses include the data bus, the address bus, and the control bus. The data bus is used to transfer data. System-wide control and timing signals are required to synchronize the operation of the separate and different modules of the memory device, and facilitate their intercommunication activities over the buses. Usually a microprocessor is in control of these buses either directly or through a bus controller and the timing of events on the buses is very important.

Data on the data bus gets latched or stored. During a new data sense time the bus is driven to a known voltage level which facilitates faster data transitions, once the new data arrives. Driving a data bus line to a known voltage level can be done with an equilibration signal used to ramp up the voltage. Typically, a separate equilibration circuit is coupled to the memory device to provide an equilibration signal. This equilibration signal attempts to equalize the voltage levels on complementary pairs of input/output lines in the memory device.

FIG. 1 shows an example of a prior art data bus line system 10 for a memory device having a memory array 20 with array output drivers 21, 22, 23, 24 that supply data signals on respective data bus lines 31, 32, 33, 34. Each data bus line 31, 32, 33, 34 has a corresponding register 41, 42, 43, 44 and corresponding output pad 51, 52, 53, 54. A clock register signal CLKREG is used to load data into each register 41, 42, 43, 44. Each register 41, 42, 43, 44 typically contains a latch and an output driver. The data bus line system 10 also has an additional register 61 and a driver 71 connected to the first data bus line 31 to provide a data feedback to the array 20.

FIG. 2 is a schematic representation of the prior art system of FIG. 1 showing some of the components of the array 20. The array 20 contains an array core 25, a sense amplifier 26, a latch 27, and an array driver 21. A data sense amplifier clock signal CLKDSA is used to operate the sense amplifier 26.

In a conventional system, such as that depicted in FIGS. 1 and 2, the data bus lines are relatively short for a given memory density. As the memory densities have become larger, however, the data bus lines have become relatively longer. Unfortunately, as data bus lines get longer, the operational speed of the memory device is reduced. Some conventional memory devices also include data bus lines having a pair of complementary output lines (commonly referred to as a dual ended data bus line). The dual ended data bus lines require more die size because of the large number of output lines and for this reason the industry preference is for a single ended data output.

Accordingly, there is a desire and need for a single ended data bus line with improved speed characteristics for use in high density memory devices.

SUMMARY OF THE INVENTION

The above mentioned problems are addressed by the present invention which incorporates a unique equilibration circuit for driving a bus line which may be used to output memory array data, address data or command data. In particular, the present invention provides an equilibration circuit that precharges the voltage of the data bus line to allow for faster recognition and latching of output data placed on the data bus line. The equilibration circuit precharges the data bus line to a voltage which is substantially midway of the logic signal voltage levels used to output data on the line.

Other features and advantages of the present invention will become apparent to those of ordinary skill in the art having reference to the following specification together with the drawings.

DETAILED DESCRIPTION OF THE PREFERRED EMBODIMENTS

In the following detailed description, reference is made to the accompanying drawings which form a part hereof, and in which is shown by way of illustration specific exemplary embodiments of the invention. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 3:
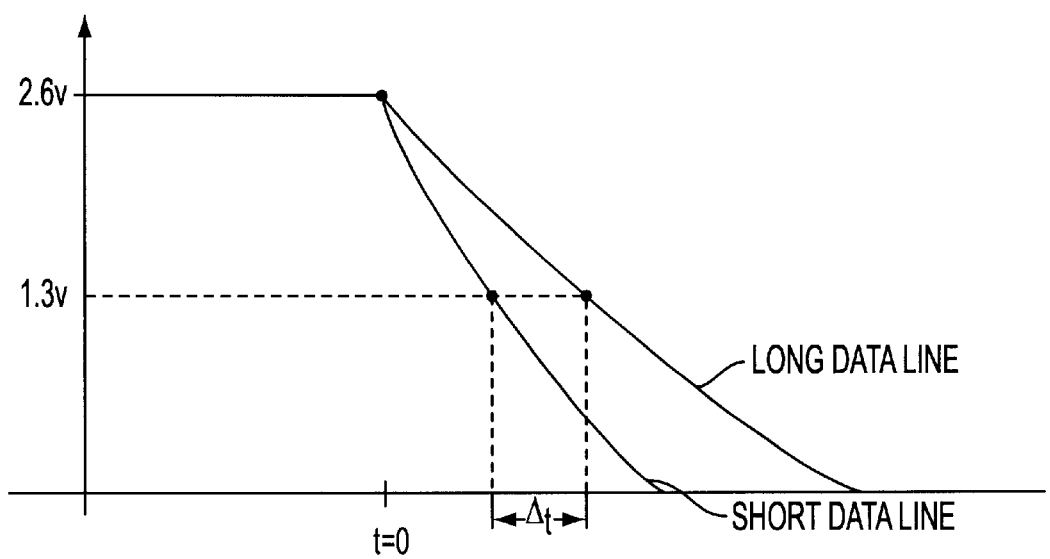
FIG. 3 is a graphical representation of voltage verses time for signal propagation over short and long data bus lines.

To facilitate an understanding of the invention it is helpful to illustrate problems caused by relatively long data lines in a memory device. FIG. 3 is a graphical representation illustrating the data signal propagation time difference for a falling edge transition between a short data line and a long data line. Typical for a data bus system, data transitions between two logic levels on a data bus line. Although the data transitions are often idealized as perfectly square wave transitions, in actual practice the rising and falling edges of a data signal take a certain amount of time to occur, due in part to the propagating electrical properties of the propagating transmission line. FIG. 3, for example, illustrates a data signal having an initial value of 2.6 volts which transitions to zero volts. As can be seen from FIG. 3 it takes a longer time for the long data signal to reach the midpoint, 1.3 volts, and the final "zero" volt point. The difference in time it takes for the falling edge to reach the midpoint voltage for a long data line as compared with a short data line is represented by Δt. Thus, it takes longer for a down stream circuit to recognize a transition in a data signal (represented by a crossing of the midpoint voltage) from 2.6 volts to zero volts. The same occurs in a transition from 0 to 2.6 volts.

Figure 1:
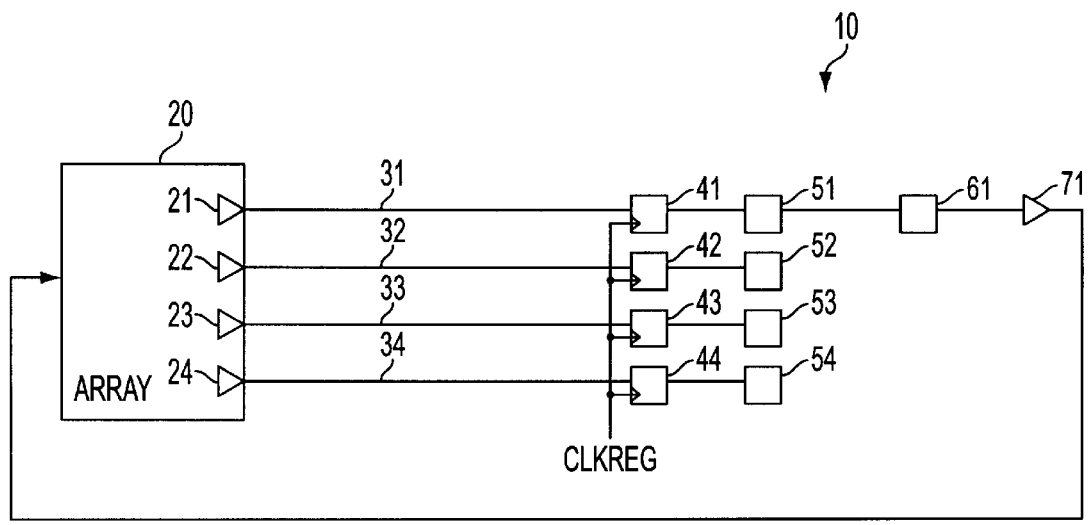
FIG. 1 is a schematic drawing illustrating a portion of a prior art memory device data output path.
Figure 2:
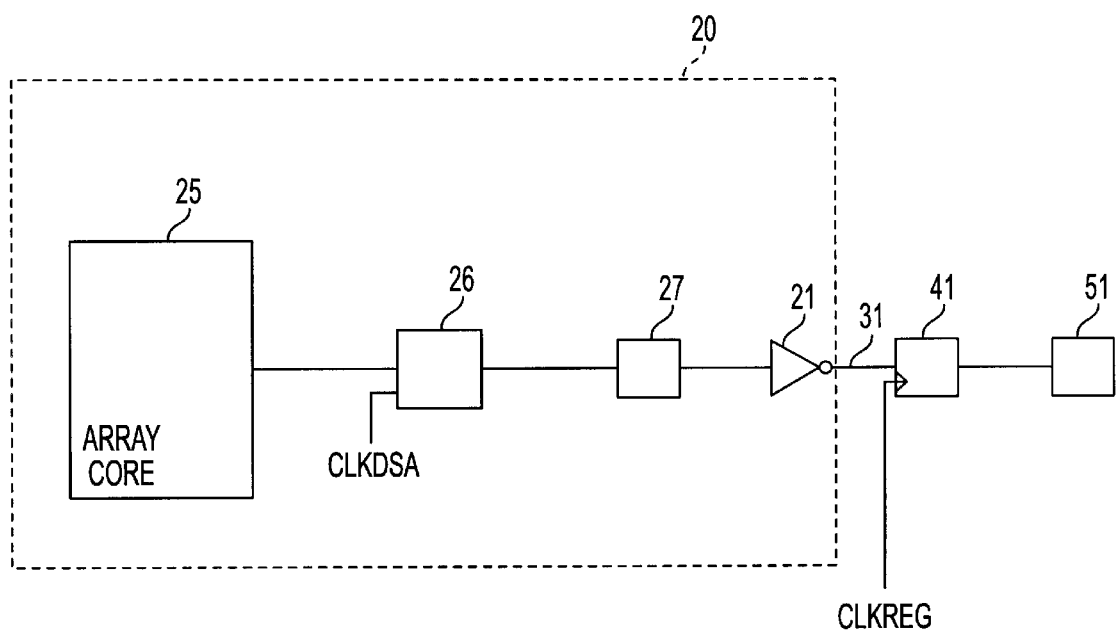
FIG. 2 is a schematic drawing illustrating the array component of the memory device portion of FIG. 1.
Figure 4:
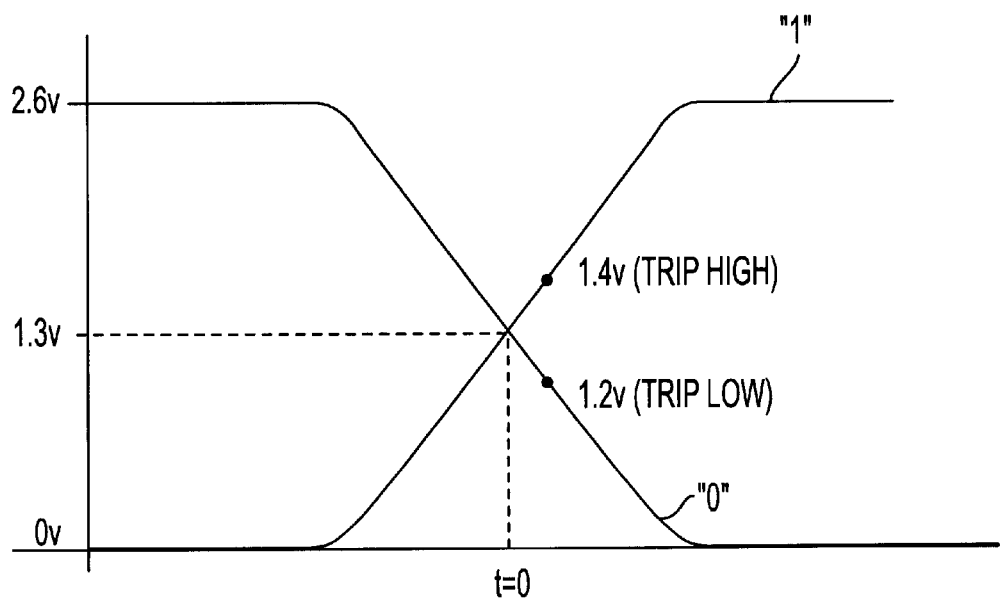
FIG. 4 is a graphical representation of data signals and their associated recognition trip points.

FIG. 4 is a graphical representation of two data signals. For example, a data bit going toward a "0" logic level is displayed as the data signal which starts at a voltage of 2.6 volts and ramps down to 0 volts. A data bit going toward a "1" logic level is displayed as the data signal which starts at 0 volts and ramps up to 2.6 volts. Referring back to FIGS. 1 and 2 each data latch 41, 42, 43, 44, will be able to recognize the data on its corresponding data bus line 31, 32, 33, 34 as a logical "1" or a "0" once the voltage reaches a set trip point of the corresponding latch 41, 42, 43, 44. For example, if 1.4 volts is used as a trip point, then once the data signal rising from 0 volts to 2.6 volts reaches the latch trip point of 1.4 volts the latch will recognize and latch the data as a logical "1" databit. Likewise, if 1.2 volts is set as a trip point, once a data signal falling from 2.6 volts to 0 volts reaches the latch trip point of 1.2 volts, the latch will recognize and latch the data as a logical 0 databit.

Since today's memory and computer systems require larger densities the use of longer data lines associated with the higher densities is unavoidable. However, as evident from FIG. 3, the difference in time Δt for transitioning data to arrive at a particular point, e.g. the trip point of FIG. 4, becomes more of a problem. The present invention provides a method and apparatus, as will be described in more detail below, for equilibrating a bus line to a predetermined voltage level just prior to receipt of a data pulse. This provides a voltage bias on the bus line approximately at the mid point of the high and low logic level voltage. Therefore, the actual applied logic signal does not need to drive the data bus line all the way from its starting voltage level to the trip point (e.g., from 0 volts to 1.4 volts or from 2.6 volts to 1.2 volts). Instead, the logic signal only needs to drive the bus line from the equilibration voltage (e.g., 1.3 volts) to the trip point, that is to 1.4 volts for a low to high transition or 1.2 volts from a high to low transition in the example described above. As a consequence, the recognition of the data signal as a "1" or "0" data bit can be performed faster as the bus line is already biased to 1.3 volts and the logic signal will only have to make the voltage on the data bus line rise or fall 0.1 volts to reach the trip point. Therefore, the trip point is reached more quickly and this allows for faster logic signal recognition.

Figure 5:
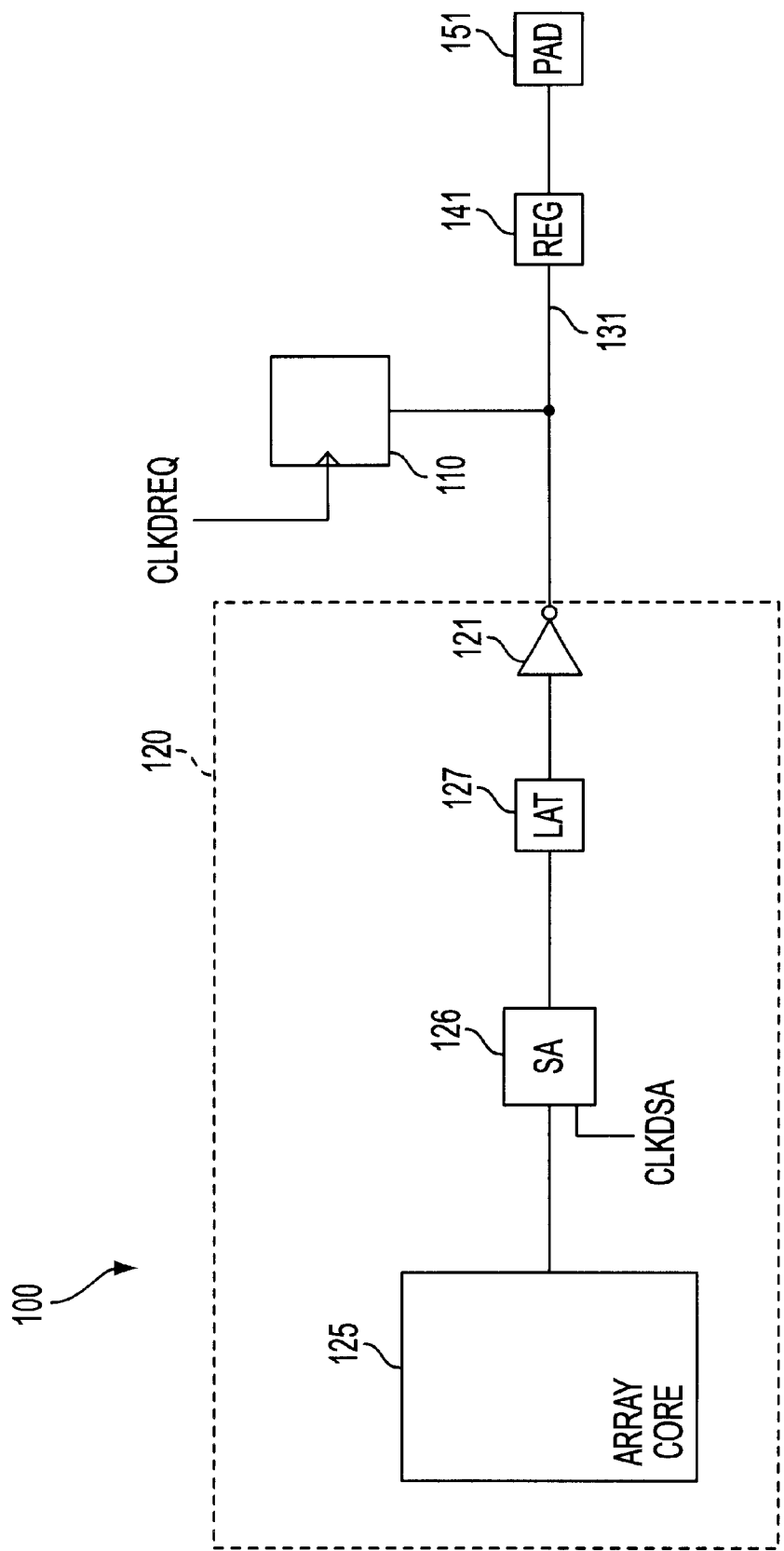
FIG. 5 is a schematic diagram of a data bus line system constructed in accordance with an exemplary embodiment of the invention.

FIG. 5 is a block diagram of a data bus system 100 having a memory array 120 and associated output circuit, a data bus line equilibration circuit 110, a data bus line 131, an output register 141 and an output pad 151. The array 120 includes an array core 125, a sense amplifier 126, a latch 127, and an array output driver 121. Register 141 is formed as a latch and driver circuit.

Figure 9:
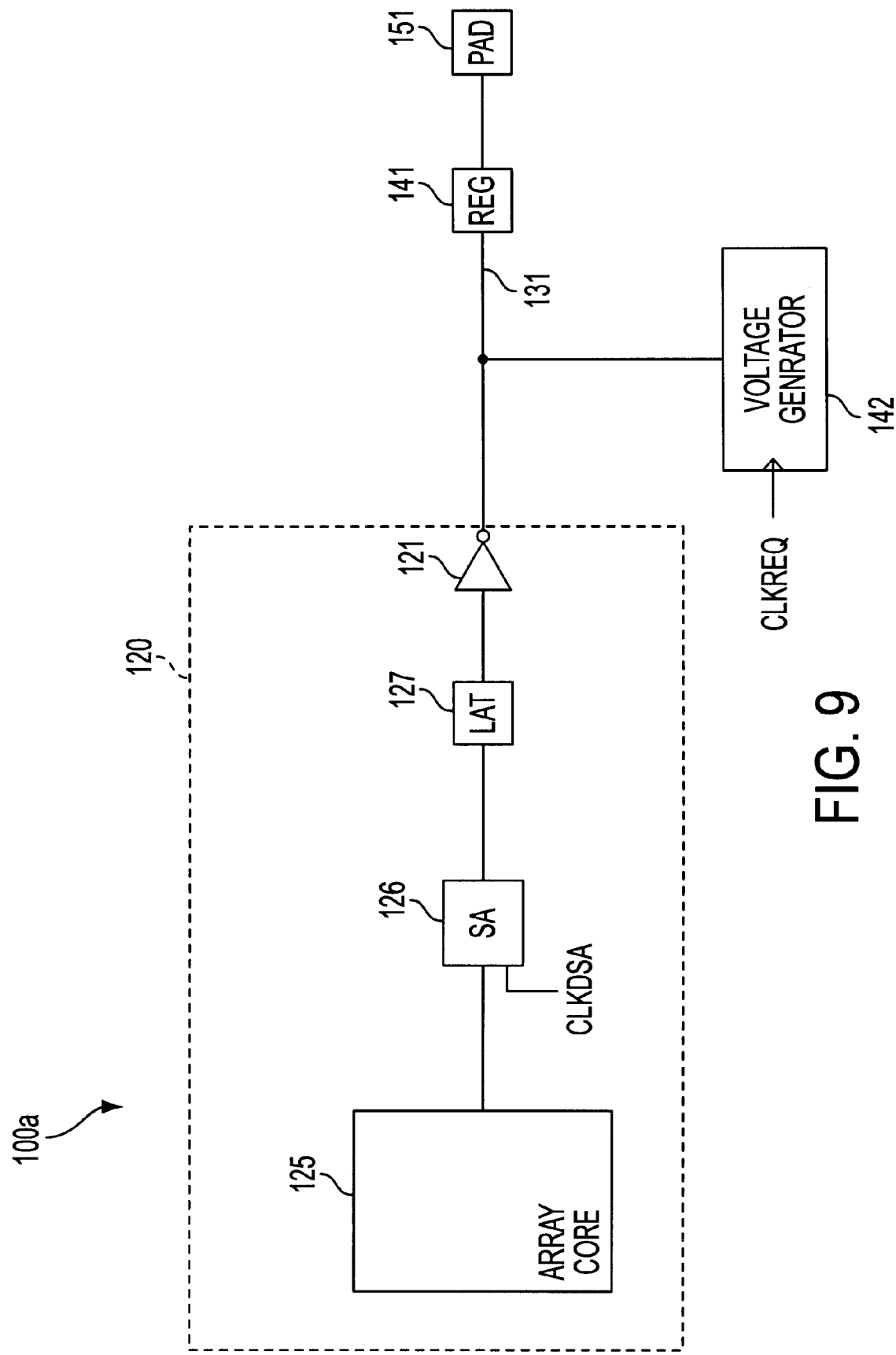
FIG. 9 is a schematic diagram of a data bus line system constructed in accordance with another exemplary embodiment of the invention.

In one exemplary embodiment, the equilibration circuit 110 may be formed as a separate voltage generator circuit 142 which drives the bus line 131 to a voltage of 1.3 volts immediately before register 141 latches in a next data bit. This structure is shown in FIG. 9, where the clock signal CLKREQ is generated at the same time as the data sense amplifier clock signal CLKDSA. When the sense amplifier 126 senses a data bit the equilibration circuit 110 (voltage generator 142) is immediately enabled and line 131 is precharged to 1.3 volts before the sensed logic signal is propagated to register 141. However, a separate voltage generator circuit 142 may be undesirable in terms of size, and power consumption.

Figure 6:
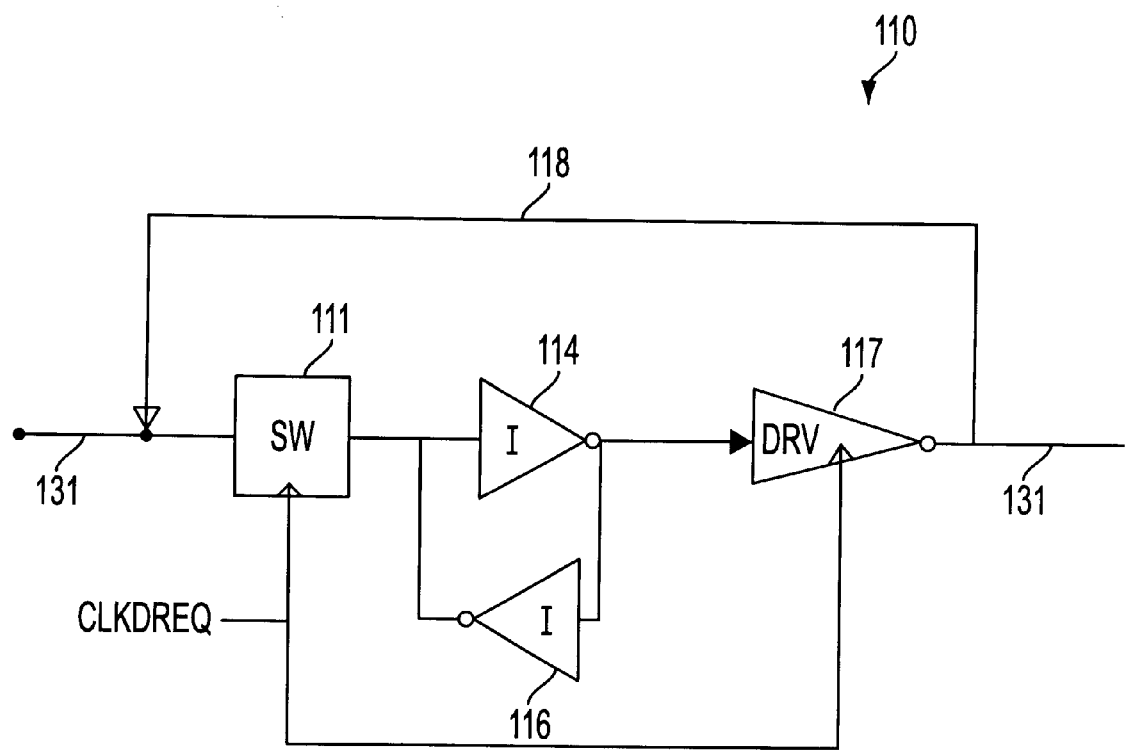
FIG. 6 is a block diagram of a portion of the circuit depicted in FIG. 5.

FIG. 6 illustrates another exemplary embodiment of the equilibration circuit 110. The equilibration circuit 110 contains a switch 111, a pair of reversely connected inverters 114, 116 and an output driver 117. A feedback line 118 extends from the output of driver 117 back to the input switch 111. Further an equilibration clock signal CLKDREQ is used to simultaneously disable the switch 111 and enable the driver 117 and vice versa.

In operation, as seen in FIGS. 5 and 6, the sense amplifier clock signal CLKDSA powers the sense amplifier 126, which senses a data bit from the array core 125 and provides the bit to the latch 127. The bit is subsequently sent down the data bus line 131 through the array driver 121.

The equilibration clock signal CLKDREQ is generated at the same time as the data sense amplifier clock signal CLKDSA. Therefore, when the sense amplifier 126 senses a data bit, the equilibration clock signal CLKDREQ disables the switch 111 and enables driver 117. The previous data signal on line 131 passes through the switch 111 before switch 111 is disabled by CLKDREQ and is stored by the latch created by inverters 114, 116. This occurs when the signal CLKDREQ is not present. Then, when the signal CLKDREQ appears, the driver 117 will take the signal stored in latch 114, 116 and begin, on the rising edge of CLKDREQ, driving bus line 131 from the signal in the latch toward its opposite logic state. The duration of CLKDREQ is selected such that driver 117 is then disabled when the output voltage of driver 117 is approximately mid-way of the logic levels for a "1" and "0" logic signals which is 1.3 volts in the example given.

Figure 7:
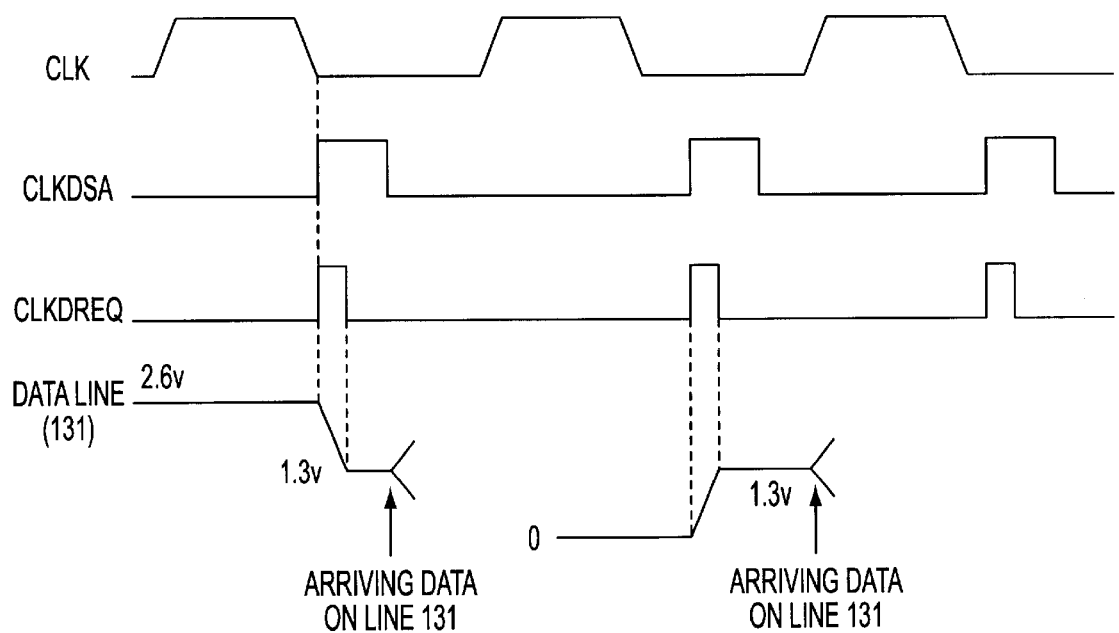
FIG. 7 is an exemplary clock signal timing diagram in accordance with an exemplary embodiment of the invention.

For example, assuming a data voltage signal of 2.6 volts representing a logic "1" entered the equilibration circuit 110 through switch 111 and is stored in latch 114, 116, the entered logic "1" data signal is inverted by the first inverter 114 to a logic "0" data signal. The logic "0" data signal is then sent to both the second inverter 116 and the driver 117. The signal sent to the second inverter 116 is inverted to a logic "1" and holds the latch formed by the two inverters 114, 116 in a stable state. The logic "0" signal at the input to driver 117 causes driver 117 to drop the logic "1" output voltage on line 131 towards a "0" output voltage under control of the CLKDREQ signal. Driver 117 stops trying to drive the signal on line 131 to a "0" level when the CLKRDEQ signal disappears and a voltage of 1.3 volts is achieved. The timing for enabling the driver 117 to produce a voltage of 1.3 volts on line 131 is controlled by varying the pulse width of the equilibration clock signal CLKDREQ. That is, CLKDREQ will disable driver 117 at a time when the signal on line 131 is approximately 1.3 volts. The 1.3 volts is then used to bias the bus line 131 for the next arriving logic signal. FIG. 7 shows a bus line 131 which is initially at logic "1" (e.g. 2.6 volts) and is driven toward the "0" logic level output by device 117 stopping at 1.3 volts under control of signal CLKREQ. FIG. 7 also shows the operation of the FIG. 6 circuit when the initial logic signal on line 131 is at a logic "0" level in which driver 117 drives the voltage on line 131 toward a logic level "1", stopping at approximately 1.3 volts, again under control of the CLKDREQ signal.

The bias voltage produced by device 117 on bus line 131 cannot pass through switch 111 which is disabled when the signal CLKDREQ is present. However, after the signal CLKDREQ disappears, a subsequent data signal on line 131 from driver 121 (FIG. 5) passes through switch 111 and is latched in latch 114, 116 for the next cycle of operation of driver 117.

The register 141 (FIG. 9) is set with predetermined trip points, typically 1.2 volts as a low trip point and 1.4 volts as a high trip point for a logic signal that transitions between 0 and 2.6 volts. As the data bit signal increases or decreases from the biased voltage of 1.3 volts it will reach the trip points in a shorter time than it would take for the signal to rise or fall from the typical starting point of 0 or 2.6 volts, which allows the register 141 to more quickly determine if the data bit signal represents 20 a logical "1" or "0". The register 141 will correspondingly latch and drive the data bit on line 131 to the proper location on the pad 151.

Referring again to FIG. 7, a system clock signal CLK, the equilibration clock signal CLKDREQ and data sense amplifier clock signal CLKDSA are illustrated. The equilibration clock signal CLKDREQ is used to disable/enable the switch 111 and correspondingly enable/disable circuit driver 117. The equilibration clock signal CLKDREQ is timed to operate in conjunction with a rising edge of the data sense amplifier clock signal CLKDSA. Therefore, the driver 117 is only enabled or powered when the sense amplifier 126 senses a new data bit or signal.

Figure 8:
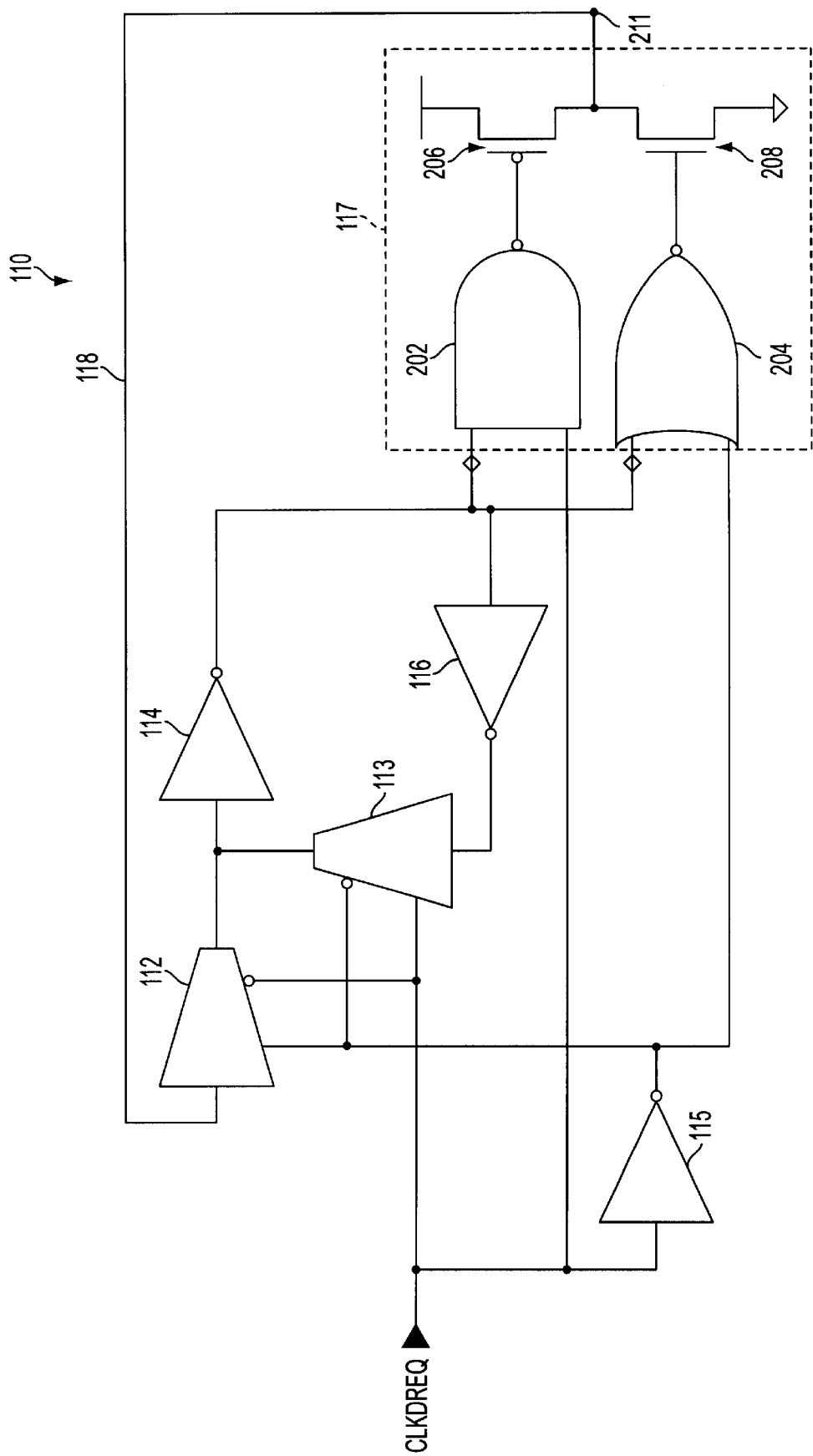
FIG. 8 is a schematic diagram of a portion of the circuit depicted in FIG. 5.

FIG. 8 is a circuit diagram for an exemplary circuit that implements the FIG. 6 equilibration circuit 110. The circuit contains two transmission gates 112, 113, three inverters 114, 115, 116, a NAND gate 202, a NOR gate 204, and a CMOS driver formed by a p-type transistor 206 and an n-type transistor 208. The two transmission gates 112, 113 form the switch 111 illustrated in FIG. 6. The NAND gate 202, NOR gate 204 and transistors 206,208 form the driver 117 illustrated in FIG. 6. The equilibration clock signal CLKDREQ is used to enable/disable the two transmission gates 112, 113 and to disable/enable the driver 117. Data from the array 120 (FIG. 5) enters the equilibration circuit 110 at node 211.

In operation, the logic signal from the array core 125 is latched by the latch 127, see FIG. 5, sent down the bus line 131 and enters the equilibration circuit 110 at node 211. The logic signal is transmitted by the feedback line 118 to the first transmission gate 112. The first transmission gate 112 is disabled by the equilibration clock signal CLKDREQ. At the same time, equilibration clock signal CLKDREQ enables the second transmission gate 113, NAND gate 202 and NOR gate 204. Once a logic signal on line 131 passes through the first transmission gate 112, the signal is inverted by the first inverter 114. The inverted signal then propagates to a both the second inverter 116 and the NAND 202 and NOR 204 gates.

When the first transmission gate 112 is enabled and opened, the second transmission gate 113 is closed. When the equilibration clock signal CLKDREQ is off, the first transmission gate 112 is open and the second transmission gate 113 is closed, thereby forming a storage latch with the first and second inverters 114, 116, that stores the voltage of the last data signal.

The NAND 202 and NOR 204 gates, in conjunction with the p-type transistor 206 and n-type transistor 208, form the driver 117 depicted in FIG. 6. The NAND 202 and NOR 204 gates are controlled by the logic level of the equilibration clock signal CLKDREQ. The NAND 202 gate is enabled by the equilibration clock signal CLKDREQ. The third inverter 115 is used to invert the equilibration clock signal CLK-DREQ. This inverted signal is used to enable the NOR gate 204 and the transmission gates 112, 113.

Based upon the voltage of the data signal received and the voltage of the clock signal received, the NAND 202 and NOR 204 gates will enable the transistors 206,208. The transistors 206 and 208 will then act as a driver to drive the biased voltage signal (e.g., 1.3 volts in the example given) the data bus line 131 through node 211.

Although the invention has been described in the environment of output data lines of memory device, the invention can be used in any digital device which has data lines for transporting data signals from one location to another.

Figure 10:
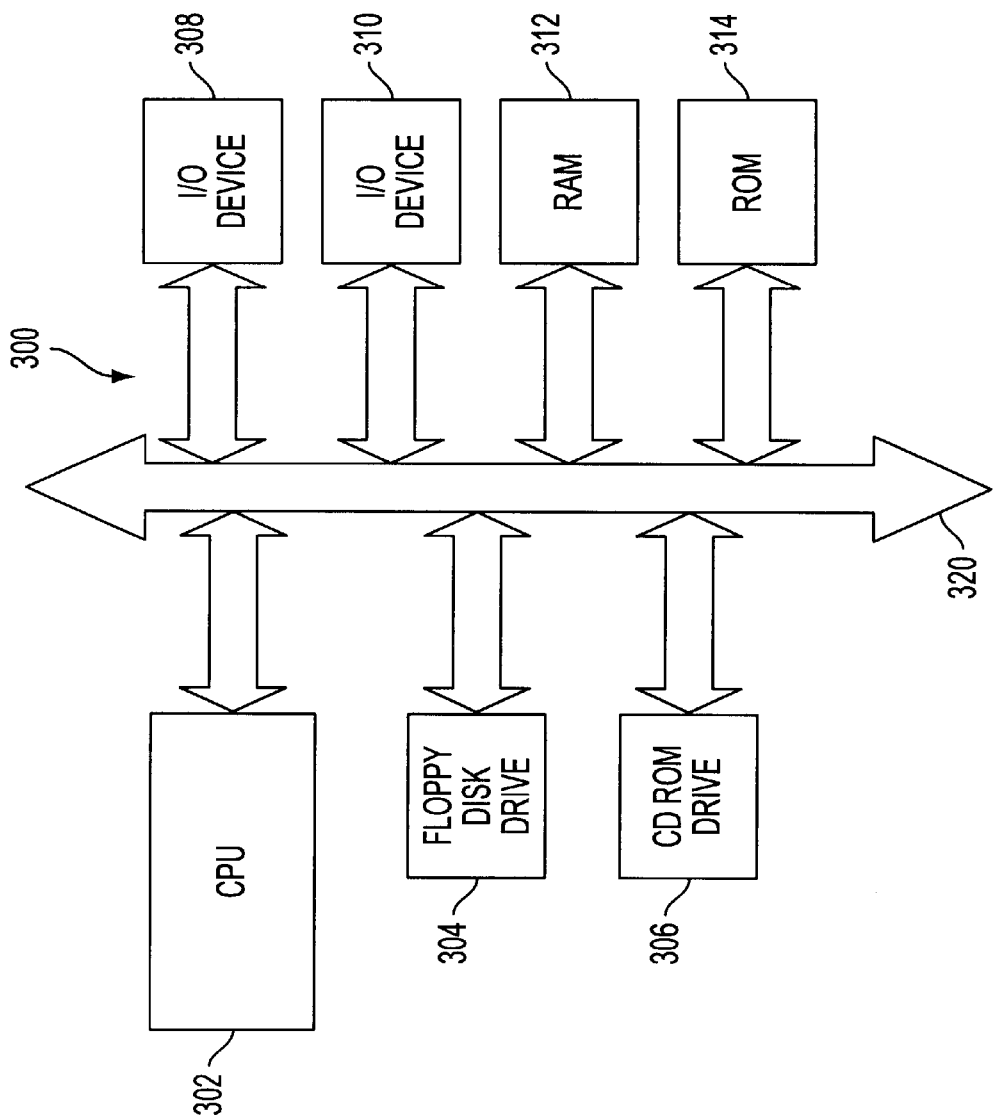
FIG. 10 is a block diagram of an exemplary processor system with which the invention may be used.

The invention may be used in a processor system. FIG. 10 is a block diagram of a processor system 300 constructed in accordance with one of the embodiments of the present invention. The processor system 300 may be a computer system, a process control system or any other system employing a processor and associated memory. The system 300 includes a central processing unit (CPU) 302, e.g., a microprocessor, that communicates with a RAM 312 and an I/O device 308 over a bus 320. It must be noted that the bus 320 may be a series of buses and bridges commonly used in a processor system, but for convenience purposes only, the bus 320 has been illustrated as a single bus. A second I/O device 310 is illustrated, but is not necessary to practice the invention. The processor system 300 also includes read-only memory (ROM) 314 and may include peripheral devices such as a floppy disk drive 304 and a compact disk (CD) ROM drive 306 that also communicates with the CPU 302 over the bus 320 as is well known in the art. The invention as described above with reference to FIGS. 5–9 may be used in any device connected to a data line of the system 300.

While the invention has been described and illustrated with respect to exemplary embodiments, it should be apparent that many modifications and substitutions may be made without departing from the spirit and scope of the invention. Accordingly, the invention is not to considered as limited by the forgoing description, but is only limited by the scope of the appended claims.

What is claimed as new and desired to be protected by Letters Patent of the United States is:

1. An output circuit for a digital device, said output circuit comprising:

a signal line for receiving and supplying an output logic signal;

an output latch for determining a logic state of said output logic signal applied to said signal line;

an output terminal coupled to said output latch for providing a device output signal; and an equilibration circuit for precharging said signal line to a predetermined voltage level prior to the arrival of said logic output signal on said signal line, said equilibration circuit comprising a switch connected to receive a logic signal on said signal line, a second latch coupled to said switch and latching a state of said logic signal, and an output driver coupled to said second latch, said driver receiving a latched voltage from the latched state of the logic signal and using said latched logic signal to provide said predetermined voltage to said signal line.

2. The output circuit as in claim 1, wherein said output latch has a first voltage trigger point for recognizing a logic signal on said signal line transitioning from a first to a second logic state and a second voltage trigger point for recognizing a logic signal on said signal line transitioning from said second to said first logic state, and wherein said predetermined voltage is between said first and second voltage trigger points.

3. The output circuit of claim 1 wherein said signal line is a bus signal line.

4. The output circuit of claim 1 wherein said signal line contains a data logic signal from a memory array.

5. The output circuit of claim 1 wherein said signal line contains an address logic signal.

6. The output circuit of claim 1 wherein said signal line contains a command logic signal.

7. The output circuit of claim 1 wherein said switch and driver are controlled by a common control signal.

8. The output circuit of claim 7 wherein said switch is disabled by said control signal when said driver is enabled by said control signal.

9. The output circuit of claim 8 wherein said switch is enabled by said control signal when said driver is disabled by said control signal.

10. The output circuit of claim 7 wherein the duration of said control signal determines the value of said predetermined voltage.

11. The output circuit of claim 8 wherein said driver, when enabled by said control signal, drives said signal line from a logic state previously stored in said second latch toward an opposite logic state.

12. The output circuit of claim 11 wherein said driver stops driving said signal line when no longer enabled by said control signal.

13. The output circuit of claim 11 wherein said control signal stops enabling said driver when an output voltage of said driver is approximately midway of the voltages on said signal line which are produced by the opposite logic states of said logic signal.

14. An integrated circuit comprising:
a memory array;
an output data line coupled to said array for receiving output data signals;
an output latch for determining a logic state of an output data signal applied to said data line;
an output terminal coupled to said output latch for providing a device output signal; and
an equilibration circuit for precharging said output data line to a predetermined voltage level prior to the arrival of a data output signal on said output data line, said equilibration circuit comprising a switch connected to receive a data output signal on said output data line, a second latch coupled to said switch and latching a state of said data output signal, and an output driver coupled to said second latch, said driver receiving a latched voltage from the latched state of the data output signal and using said latched voltage to provide said predetermined voltage to said data output signal line.

15. The integrated circuit of claim 14, wherein said output latch has a first voltage trigger point for recognizing a data output signal on said output data line transitioning from a first to a second logic state and a second voltage trigger point for recognizing a data output signal on said output data line transitioning from said second to said first logic state, and wherein said predetermined voltage is between said first and second voltage trigger points.

16. The integrated circuit of claim 14 wherein said output data line is a bus line.

17. The integrated circuit of claim 14 wherein said switch and said drive are controlled by a common control signal.

18. The integrated circuit of claim 17 wherein said switch is disabled by said control signal when said driver is enabled by said control signal.

19. The integrated circuit of claim 18 wherein said switch is enabled by said control signal when said driver is disabled by said control signal.

20. The integrated circuit of claim 17 wherein the duration of said control signal determines the value of said predetermined voltage.

21. The integrated circuit of claim 18 wherein said driver, when enabled by said control signal, drives said output data line from a logic state previously stored in said second latch toward an opposite logic state.

22. The integrated circuit of claim 21 wherein said driver stops driving said signal line when no longer enabled by said control signal.

23. The integarted circuit of claim 21 wherein said control signal stops enabling said driver when an output voltage of said driver is approximately midway of the voltages on said output data line which are produced by the logic states of said output data signal.

24. The integrated circuit of claim 14, wherein said data line is part of a single ended data bus.

25. A processor system comprising:
a processor; and
a memory device coupled to said processor, wherein at least one of said processor and memory device comprises:
an output data line coupled for receiving output data signals;
an output latch for determining a logic state of an output data signal applied to said data line;
an output terminal coupled to said output latch for providing a device output signal; and
an equilibration circuit for precharging said output data line to a predetermined voltage level prior to the arrival of a data output signal on said output data line, said equilibration circuit comprising a switch connected to receive a data output signal on said output data line, a second latch coupled to said switch and latching a state of said data output signal, and an output driver coupled to said second latch, said driver receiving a latched voltage from the latched state of the data output signal and using said latched voltage to provide said predetermined voltage to said data output signal line.

26. The system of claim 25, wherein said output latch has a first voltage trigger point for recognizing a data output signal on said output data line transitioning from a first to a second logic state and a second voltage trigger point for recognizing a data output signal on said output latch line transitioning from said second to said first logic state, and wherein said predetermined voltage is between said first and second voltage trigger points.

27. The system of claim 25 wherein said output data line is a bus line.

28. The system of claim 25 wherein said switch and said driver are controlled by a common control signal.

29. The system of claim 28 wherein said switch is disabled by said control signal when said driver is enabled by said control signal.

30. The system of claim 29 wherein said switch is enabled by said control signal when said driver is disabled by said control signal.

31. The system of claim 28 wherein the duration of said control signal determines the value of said predetermined voltage.

32. The system of claim 29 wherein said driver, when enabled by said control signal, drives said signal line from a logic state previously stored in said second latch toward an opposite logic state.

33. The system of claim 32 wherein said driver stops driving said output data line when no longer enabled by said control signal.

34. The system of claim 32 wherein said control signal stops enabling said driver when an output voltage of said driver is approximately midway of the voltages on said signal line which are produced by the opposite logic states of said output data signal.

35. The system of claim 25, wherein said data line is part of a single ended data bus.

36. A processor system comprising:

a processor; and a memory device comprising a memory array and being coupled to said processor, wherein at least one of said processor and memory device comprises:

a memory array;

an output data line coupled to said array for receiving output data signals;

an output latch for determining a logic state of an output data signal applied to said data line;

an output terminal coupled to said output latch for providing a device output signal;

a switch connected to receive an output data signal applied to said data line;

a second latch coupled to said switch and latching a state of the data output signal; and an output driver coupled to said latch, said driver receiving a latched voltage from said second latch and using the latched voltage to produce a precharge voltage on said output data line for a subsequently arriving data output signal.

37. A method of equilibrating a single ended signal line comprising:

receiving a logic data signal on the signal line;

receiving a clock signal; and using a signal derived from said clock signal and a previous logic data signal to develop a bias voltage on said signal line before the receipt of a subsequent logic signal on said signal line.

38. The method of claim 37 further comprising deriving a control signal from said clock signal and using said control signal to operate an equilibrium circuit which produces said bias voltage.

39. The method of claim 38, further comprising the step of varying the duration of said control signal to control said equilibrium circuit to adjust the bias voltage provided to said signal line.

40. The method of claim 39, wherein said equilibration circuit stores a previous logic signal on said data line and uses said stored previous logic signal to produce said bias voltage.

41. The method of claim 40 wherein said equilibration circuit generates a voltage which moves from said stored previous logic signal toward a logic signal of opposite state in response to said control signal.

42. The method of claim 41 wherein said equilibration circuit stops moving toward said opposite state logic signal in response to a predetermined state of said control signal.

43. The method of claim 37, wherein a first voltage trigger point is used for recognizing a logic signal on said line transitioning from a first to a second logic state and a second voltage trigger point is used for recognizing a logic signal on said line transitioning from said second to said first logic state, and wherein said bias voltage is between said first and second voltage trigger points.

\* \* \* \* \*

UNITED STATES PATENT AND TRADEMARK OFFICE
CERTIFICATE OF CORRECTION

PATENT NO.    : 6,411,553 B1                                        Page 1 of 1
DATED         : June 25, 2002
INVENTOR(S)   : Jeffrey P. Wright et al.

It is certified that error appears in the above-identified patent and that said Letters Patent is hereby corrected as shown below:

Column 3,
Line 31, "At" should read -- $\Delta t$ --.

Column 5,
Line 14, "represents 20 a" should read -- represents a --.

Signed and Sealed this

Twenty-first Day of January, 2003

JAMES E. ROGAN
*Director of the United States Patent and Trademark Office*